(12) United States Patent
Jayasundara et al.

(10) Patent No.: US 11,096,275 B2
(45) Date of Patent: Aug. 17, 2021

(54) APPARATUS FOR LAYING CONDUCTIVE PATHWAYS, METHOD OF LAYING CONDUCTIVE PATHWAYS AND TEXTILE PRODUCT COMPRISING CONDUCTIVE PATHWAYS

(71) Applicant: MAS INNOVATION (PRIVATE) LIMITED, Colombo (LK)

(72) Inventors: Kosalasiri Jayasundara, Colombo (LK); Raweendra Kumara, Colombo (LK); Ranil Vitharana, Colombo (LK)

(73) Assignee: MAS INNOVATION (PRIVATE) LIMITED, Colombo (LK)

( * ) Notice: Subject to any disclaimer, the term of this patent is extended or adjusted under 35 U.S.C. 154(b) by 0 days.

(21) Appl. No.: 16/067,871

(22) PCT Filed: Jan. 3, 2017

(86) PCT No.: PCT/SG2017/050001
§ 371 (c)(1),
(2) Date: Jul. 3, 2018

(87) PCT Pub. No.: WO2017/119847
PCT Pub. Date: Jul. 13, 2017

(65) Prior Publication Data
US 2019/0116665 A1    Apr. 18, 2019

(30) Foreign Application Priority Data

Jan. 4, 2016 (GB) ...................................... 1600095

(51) Int. Cl.
*H05K 1/02* (2006.01)
*H05K 1/03* (2006.01)
(Continued)

(52) U.S. Cl.
CPC ........... *H05K 1/0283* (2013.01); *A41D 1/005* (2013.01); *B32B 3/08* (2013.01); *B32B 5/02* (2013.01);
(Continued)

(58) Field of Classification Search
CPC .... H05K 1/0283; H05K 3/1241; H05K 3/103; H05K 3/281; H05K 2203/1545;
(Continued)

(56) References Cited

U.S. PATENT DOCUMENTS

| 3,253,073 A | 5/1966 | Skobel |
| 6,341,504 B1 * | 1/2002 | Istook ................. A61B 5/0002 2/69 |

(Continued)

FOREIGN PATENT DOCUMENTS

| JP | 2-119015 A | 5/1990 |
| JP | 7-29430 A | 1/1995 |

(Continued)

OTHER PUBLICATIONS

International Preliminary Report on Patentability dated Jul. 19, 2018, for PCT Application No. PCT/SG2017/050001, filed Jan. 3, 2017, 9 pages.

(Continued)

*Primary Examiner* — Ishwarbhai B Patel
(74) *Attorney, Agent, or Firm* — Mintz Levin Cohn Ferris Glovsky and Popeo, P.C.

(57) ABSTRACT

A conductive tape formed by laying a conductive pathway on a tape layer is disclosed. Various apparatus and methods for laying conductive pathways to form conductive tape are disclosed. The conductive pathways may be laid by varying the lateral position of the conductive pathway on the tape substrate. Such patterns all stretchable conductive tape to be realized. Multiple conductive pathways may be laid in the (Continued)

tape and the lateral separation of the pathways in the tape may vary. In some embodiments the pathways are formed from conductive yarn or by printing or laying conductive ink.

14 Claims, 9 Drawing Sheets

(51) Int. Cl.
| | |
|---|---|
| H05K 3/10 | (2006.01) |
| H05K 3/12 | (2006.01) |
| A41D 1/00 | (2018.01) |
| B32B 7/12 | (2006.01) |
| B32B 5/02 | (2006.01) |
| B32B 5/24 | (2006.01) |
| B32B 3/08 | (2006.01) |
| H05K 3/28 | (2006.01) |

(52) U.S. Cl.
CPC .............. *B32B 5/24* (2013.01); *B32B 7/12* (2013.01); *H05K 3/103* (2013.01); *H05K 3/1241* (2013.01); *B32B 2250/02* (2013.01); *B32B 2250/04* (2013.01); *B32B 2250/40* (2013.01); *B32B 2307/202* (2013.01); *B32B 2307/4023* (2013.01); *B32B 2405/00* (2013.01); *B32B 2437/00* (2013.01); *H05K 1/038* (2013.01); *H05K 3/281* (2013.01); *H05K 2201/09263* (2013.01); *H05K 2201/10287* (2013.01); *H05K 2203/0126* (2013.01); *H05K 2203/0278* (2013.01); *H05K 2203/1545* (2013.01)

(58) Field of Classification Search
CPC ... H05K 2203/0278; H05K 2203/0126; H05K 2201/10287; H05K 2201/09263; H05K 1/0271; H05K 1/0278; H05K 1/08; H05K 1/0284; H05K 1/0296; H05K 1/038; H05K 1/0393; H05K 1/118; H05K 2201/05; H05K 2201/09272; H05K 2201/09281; B32B 3/08; B32B 7/12; B32B 5/24; B32B 5/02; B32B 2437/00; B32B 2307/4023; B32B 2307/202; B32B 2250/40; B32B 2250/04; B32B 2250/02; B32B 2405/00; A41D 1/005
See application file for complete search history.

(56) References Cited

U.S. PATENT DOCUMENTS

| | | | |
|---|---|---|---|
| 9,211,085 B2 * | 12/2015 | Streeter | A61B 5/6831 |
| 2009/0317639 A1 * | 12/2009 | Axisa | B32B 37/185 |
| | | | 428/411.1 |
| 2011/0026233 A1 | 2/2011 | Hong et al. | |
| 2014/0318699 A1 * | 10/2014 | Longinotti-Buitoni | A61B 5/0002 |
| | | | 156/247 |
| 2017/0094774 A1 * | 3/2017 | Elsherbini | H05K 1/028 |
| 2017/0181275 A1 * | 6/2017 | Dias | H05K 1/0283 |

FOREIGN PATENT DOCUMENTS

| | | |
|---|---|---|
| KR | 10-2011-0019309 A | 2/2011 |
| KR | 2012-0139431 A | 12/2012 |
| WO | 2004/107973 A1 | 12/2004 |
| WO | WO 2015/108427 A1 * | 7/2015 |

OTHER PUBLICATIONS

International Search Report dated Apr. 7, 2017 corresponding to PCT/SG2017/050001 filed Jan. 3, 2017, 3 pages.
Search Report dated May 10, 2016 corresponding to (priority application) GB1600095.2 filed Jan. 4, 2016, 5 pages.

\* cited by examiner

APPARATUS FOR LAYING CONDUCTIVE PATHWAYS, METHOD OF LAYING CONDUCTIVE PATHWAYS AND TEXTILE PRODUCT COMPRISING CONDUCTIVE PATHWAYS

FIELD OF THE INVENTION

Embodiments of the present invention relate to the incorporation of pathways in textile products.

BACKGROUND OF THE INVENTION

Wearable technology in which electronic devices are worn by a user has seen rapid growth in recent years. The use of wearable technology often involves a requirement to transmit electronic signals or energy from one device or sensor to another. One way of achieving this is the incorporation of conductive pathways into the clothing of the user. An advantage of incorporating conductive pathways into the clothing of a user is that external wires are not required and that the conductors incorporated are much reliable and withstand wash cycles, stretch and bending than external wires.

However, the encapsulation of conductive pathways into clothing and other products presents a number of challenges. The conductive pathways formed from for example conductive yarns may be incorporated into the fabric of the clothing, however this presents difficulties in establishing connections with the conductive pathways. Alternatively, the conductive pathways may be incorporated into separate fabric pieces; however, this results in the number of fabric layers which are included in the final product.

SUMMARY OF THE INVENTION

According to a first aspect of the present invention, an apparatus for laying conductive pathways on a tape to form a conductive tape. The apparatus comprises: a pair of surfaces arranged to apply a bonding pressure; a first conductive pathway laying device configured to lay a first conductive pathway on the tape and configured to vary the lateral position of the first conductive pathway as the tape moves through the pair of surfaces.

According to an embodiment of the present invention the apparatus further comprises a second conductive pathway laying device configured to lay a second conductive pathway on the tape and configured to vary the lateral position of the second conductive pathway as the tape moves through the pair of surfaces, wherein the first conductive pathway laying device and/or the second conductive pathway laying device are configured to vary a lateral separation between the first conductive pathway and the second conductive pathway.

In an embodiment, the first conductive pathway laying device comprises a first yarn position controller arranged to control the lateral position of a first conductive yarn on the tape when the bonding pressure is applied.

In an embodiment, the second conductive pathway laying device comprises a second yarn position controller arranged to control the lateral position of a second conductive yarn on the tape when the bonding pressure is applied.

The first and/or second yarn position controller may comprise a nozzle.

According to an aspect of the present invention there is provided an apparatus for laying conductive yarn on a tape to form an conductive tape. The apparatus comprises: a pair of surfaces arranged to apply a bonding pressure; a first yarn position controller arranged to control the lateral position of a first conductive yarn on the tape when the bonding pressure is applied and configured to vary the position of the first yarn guide as the tape moves through the pair of surfaces.

Embodiments of the present invention allow conductive pathways such as conductive yarn to be laid in the tape in a repeating pattern which allows the tape to be stretched in a longitudinal direction.

The conductive tape can be incorporated into clothing and other fabric products without a large increase in the number of layers in the final product.

Conductive yarn such as silver coated yarns, silver yarns, stainless steel coated yarns, copper coated yarns, tin coated yarns and stainless steel yarns can be used in embodiments of the present invention. Yarns of different thickness and conductivity can be used with embodiments of the present invention.

In some embodiments the first and/or the second conductive pathway laying device comprises a nozzle configured to lay a conductive ink on the tape. In some embodiments, the apparatus further comprises a curing unit operable to cure the conductive ink on the tape.

In some embodiments the first conductive pathway laying device is configured to vary the lateral position of the first conductive pathway such that the first conductive pathway forms a first repeating pattern on the conductive tape and/or the second conductive pathway laying device is configured to vary the lateral position of the second conductive pathway such that the second conductive pathway forms a second repeating pattern on the conductive tape.

According to an embodiment of the present invention, the apparatus further comprises: a second yarn position controller arranged to control the lateral position of a second conductive yarn on the tape when the bonding pressure is applied and configured to vary the position of the second conductive yarn as the tape moves through the pair of surfaces, wherein the first yarn position controller and the second yarn position controller are configured to vary a lateral separation of the first conductive yarn and the second conductive yarn.

By varying the lateral separation of the first and second conductive pathways, it is possible to maintain a tangential separation between the two pathways while reducing the overall width of the combined pattern and therefore the conductive tape.

In an embodiment the first conductive pathway laying device is configured to vary the lateral position of the first conductive pathway such that the first conductive pathway forms a first repeating pattern on the conductive tape and/or the second conductive pathway laying device is configured to vary the lateral position of the second conductive pathway such that the second conductive pathway forms a second repeating pattern on the conductive tape.

The first repeating pattern and/or the second repeating pattern may be repeating curved patterns. The repeating curved patterns may be triangle patterns, sinusoidal patterns or modified sinusoidal pattern. The modified sinusoidal pattern is a sinusoidal pattern modified to maintain a tangential distance between the first conductive pathway and second conductive pathway above a minimum tangential distance. This enables two or more yarns to be arranged within a minimum space while maintaining a separation between the pathway.

The apparatus may comprise rollers or a pair of conveyer belts.

In an embodiment the first and/or second conductive pathway laying device comprises a linear guide.

According to an aspect of the present invention there is provided a method of manufacturing a conductive tape. The method comprises: laying a first conductive pathway on a first tape layer; bonding the first conductive pathway to the first tape layer to form the conductive tape by applying a heat and/or bonding pressure at a bonding point; moving the conductive tape relative to the bonding point in a longitudinal direction; and varying the lateral position of the first conductive pathway at the bonding point as the conductive tape moves in the longitudinal direction so that the lateral position of the first conductive pathway within the conductive tape forms a repeating pattern.

According to a further aspect of the present invention there is provided a method of manufacturing a conductive tape. The method comprises positioning conductive yarn between on a first tape layer; bonding conductive yarn to the first tape layer to form the conductive tape by applying a heat and/or bonding pressure at a bonding point; moving the conductive tape relative to the bonding point in a longitudinal direction; and varying the lateral position of the conductive yarn at the bonding point as the conductive tape moves in the longitudinal direction so that the lateral position of the conductive yarn on the conductive tape forms a repeating pattern.

Two or more conductive pathways such as conductive yarns may be positioned on the first tape layer. Thus positioning conductive yarn on a first tape layer may comprise positioning a first conductive yarn and a second conductive yarn on the first tape layer.

In an embodiment the method further comprises varying the lateral separation between the first conductive pathway and the second conductive pathway so that a tangential distance between the first conductive yarn and second conductive yarn is maintained above a minimum tangential distance.

In an embodiment, the method comprises varying a lateral velocity of the first conductive pathway such that the lateral velocity is higher when the first conductive pathway is moving away from the second conductive pathway than when the first conductive pathway is moving towards the second conductive pathway.

In an embodiment, the method comprises varying a pattern of the first and/or second conductive pathway between a first sinusoidal function and a second sinusoidal function, the second sinusoidal function having a greater amplitude than the first sinusoidal function.

According to a third aspect of the present invention there is provided a method of laying conductive yarn on a substrate. The method comprises: laying a first conductive yarn by varying a lateral position of the first conductive yarn on the substrate to form a first repeating pattern; and laying a second conductive yarn by varying a lateral position of the second conductive yarn on the substrate to form a second repeating pattern, wherein the lateral separation of the first conductive yarn and the second conductive yarn varies to maintain a minimum tangential separation of the first conductive yarn and the second conductive yarn.

According to a further aspect of the present invention there is provided a method of printing a conductive pathways on a substrate. The method comprises: applying a first conductive pathway to the substrate by varying a lateral position of a first nozzle configured to apply conductive ink to the substrate to form a first repeating pattern; and applying a second conductive pathway to the substrate by varying a lateral position of a second nozzle configured to apply conductive ink to the substrate to form a second repeating pattern, wherein the lateral separation of the first nozzle and the second nozzle varies to maintain a minimum tangential separation of the first conductive pathway and the second conductive pathway.

The substrate may be a stretchable substrate.

According to a further aspect of the present invention there is provided a textile product. The textile product comprises a substrate; and a first conductive pathway and a second conductive pathway disposed on or within the substrate, wherein the lateral separation of the first conductive pathway and the second conductive pathway varies to maintain a minimum tangential separation of the first conductive pathway and the second conductive pathway.

The first conductive pathway may comprise a first conductive yarn and the second conductive pathway a second conductive yarn. The first conductive pathway and/or the second conductive pathway may be printed with a conductive ink.

BRIEF DESCRIPTION OF THE DRAWINGS

In the following, embodiments of the present invention will be described as non-limiting examples with reference to the accompanying drawings in which:

FIG. 2b shows a cross section of a textile product incorporating the conductive tape shown in FIG. 2a;

DETAILED DESCRIPTION

Embodiments of the present invention relate to the laying of conductive pathways in substrates such as a tape. In some of the embodiments described below the conductive pathways are formed by laying a conductive yarn. It will be appreciated that the patterns described herein with reference to a conductive yarn may also be formed by other laying techniques such as printing or laying a conductive ink onto the substrate.

Figure 1A:
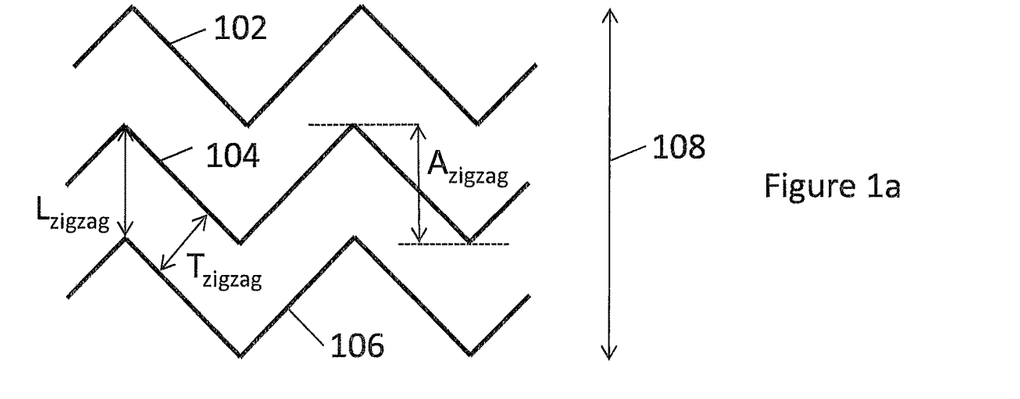
FIGS. 1a to 1c show patterns for laying conductive yarn which may be used in embodiments of the present invention.
Figure 1B:
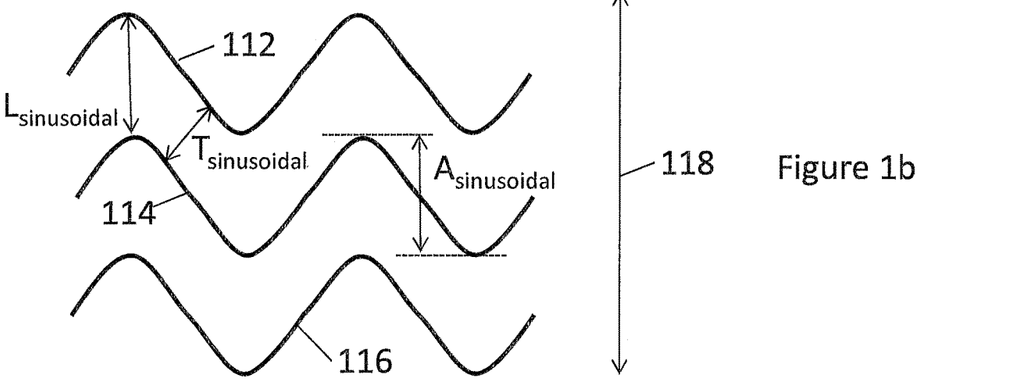
Figure 1C:
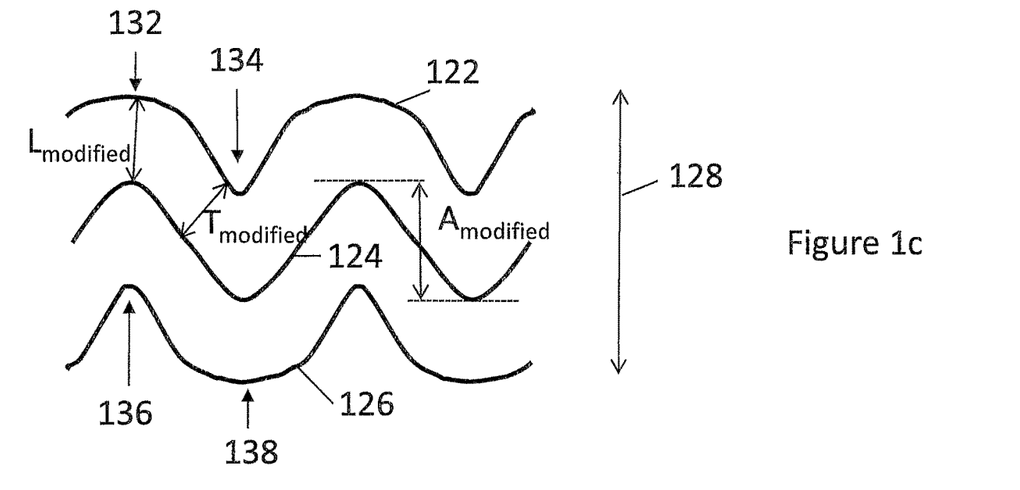

FIGS. 1a to 1c show patterns for laying conductive yarn which may be used in embodiments of the present invention. In each of the patterns shown in FIG. 1, the conductive yarn follows a path in a horizontal direction and the pattern involves a lateral displacement from this direction in a repeating pattern. The reason for including this displacement in the patterns is to allow the fabric on which the conductive yarn is laid to be stretched.

By varying the pattern, different stretch requirements can be achieved. For example, by increasing the peak to peak amplitude of the pattern the stretchability of the can be increased.

FIG. 1a shows conductive yarn laid in a zigzag pattern. As shown in FIG. 1a, a first conductive yarn 102, a second conductive yarn 104 and a third conductive yarn 106 are each laid in a zigzag pattern. As shown in FIG. 1a, the zigzag pattern has a peak to peak amplitude $A_{zigzag}$, the lateral separation of the conductive yarn paths is $L_{zigzag}$, and the minimum tangential separation of the conductive yarn paths is $T_{zigzag}$.

The total width 108 required for the three conductive yarn paths shown in FIG. 1a is: $2L_{zigzag}+A_{zigzag}$.

FIG. 1b shows conductive yarn laid in a sinusoidal pattern. As shown in FIG. 1b, a first conductive yarn 112, a second conductive yarn 114 and a third conductive yarn 116 are each laid in a sinusoidal pattern. As shown in FIG. 1b, the zigzag pattern has a peak to peak amplitude $A_{sinusoidal}$, the lateral separation of the conductive yarn paths is $L_{sinusoidal}$, and the minimum tangential separation of the conductive yarn paths is $T_{sinusoidal}$.

The total width 118 required for the three conductive yarn paths shown in FIG. 1b is: $2L_{sinusoidal}+A_{sinusoidal}$.

As described above, for both the zigzag pattern and the sinusoidal pattern, the total width required depends on the lateral separation of the conductive yarn paths. However, it is noted that the minimum separation of the conductive yarn paths in the patterns shown FIGS. 1a and 1b which are the minimum tangential separations $T_{zigzag}$, and $T_{sinusoidal}$ are significantly less than the lateral separations of the conductive yarn paths.

Since the different conductive yarn paths may carry different electrical signals, it is important to minimize interference between the conductive yarn paths. Such interference may occur due to the conductive yarn paths coming into contact with each other when the fabric or substrate on which they are laid is stretched, or the separation between two paths falling below a threshold.

Thus, it is the minimum separation of the conductive yarn paths which plays an important role in the performance of the laid conductive yarn. Further, it is also advantageous to minimize the width of the conductive yarn paths.

FIG. 1c shows conductive yarn laid in a modified sinusoidal pattern. As shown in FIG. 1b, a first conductive yarn 122, a second conductive yarn 124 and a third conductive yarn 126 are laid in a paths which run in a horizontal direction with varying displacement in a vertical direction. In the pattern shown in FIG. 1c, the second conductive yarn 124 which is in the center of the pattern has follows a sinusoidal path. The sinusoidal path followed by the second conductive yarn is symmetrical such that the shape of the maxima and minima of the curve are the same.

The first conductive yarn 122 runs above the second conductive yarn 124. The path followed by the first conductive yarn 122 is modified from a sinusoidal path so that the shapes of maxima and minima of the path are not symmetrical with one another. The asymmetry of the path followed by the first conductive yarn 122 may be described in terms of the different curvature at the maxima and minima of the curve. Here the curvature is defined as the inverse of the radius of curvature, so a part of the path with a low radius of curvature is considered to have a high curvature whereas a path of the path with a high radius of curvature is considered to have a low curvature.

As shown in FIG. 1c, at the maxima 132 of the path followed by the first conductive yarn 122, the curvature of the path is lower than the curvature of the sinusoidal path followed by the second conductive yarn 124. At the minima 134 of the path followed by the first conductive yarn 122, the curvature of the path is greater than the curvature of the sinusoidal path followed by the second conductive yarn 124.

The third conductive yarn 126 runs below the second conductive yarn 124. The path followed by the third conductive yarn 126 is modified from a sinusoidal path in an analogous manner to the path followed by the first conductive yarn 122. As shown in FIG. 1c, at the maxima 136 of the path followed by the third conductive yarn 126, the curvature is higher than the curvature of the sinusoidal path followed by the is second conductive yarn 124. At the minima 138 of the path followed by the third conductive yarn 126, the curvature is lower than the curvature of the sinusoidal path followed by the second conductive yarn 124.

As shown in FIG. 1c, the modified pattern has a peak to peak amplitude $A_{modified}$, the lateral separation at the maxima 132 of the path of the first conductive yarn 122 of the conductive yarn paths is $L_{modified}$, and the minimum tangential separation of the conductive yarn paths is $T_{modified}$.

The total width 128 required for the three conductive yarn paths shown in FIG. 1a is: $2L_{modified}+A_{modified}$. This is based on the assumption that the path of the first conductive yarn 122 is a mirror image shifted in the horizontal direction of the path of the third conductive yarn 126.

Comparing FIGS. 1b and 1c it can be seen that the variation of the tangential separation between the paths of the modified sinusoidal pattern is lower than the variation of the tangential separation of the paths of the unmodified sinusoidal pattern.

Further, the lateral separation of the first conductive yarn 122 and the second conductive yarn 124 at the maxima 132 of the path of the first conductive yarn 122 in the modified sinusoidal pattern shown in FIG. 1c is lower than the lateral separation of the sinusoidal pattern shown in FIG. 1b. Since the total width of the patterns depends on this lateral separation this has the result that the total width 128 of the modified sinusoidal pattern shown in FIG. 1c is lower than the total width 118 of the sinusoidal pattern shown in FIG. 1b. Thus, the modified sinusoidal pattern shown in FIG. 1c allows the total width of the pattern to be reduced while maintaining the tangential separation of the conductive yarn paths of given peak to peak amplitude of lateral displacement.

In order to produce the pattern shown in FIG. 1c, the lateral separation of the conductive yarn paths varies along the length of the paths.

Figure 2A:
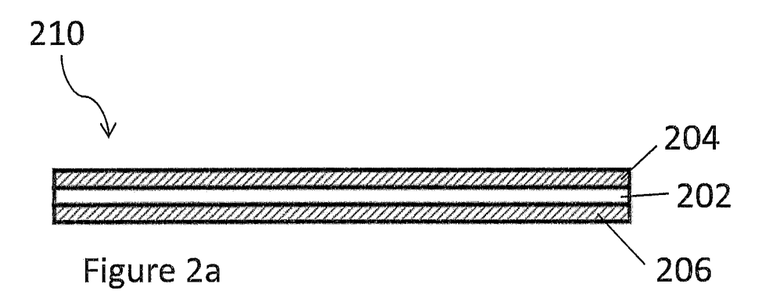
FIG. 2a shows a cross section of a conductive tape according to an embodiment of the present invention.
Figure 2B:
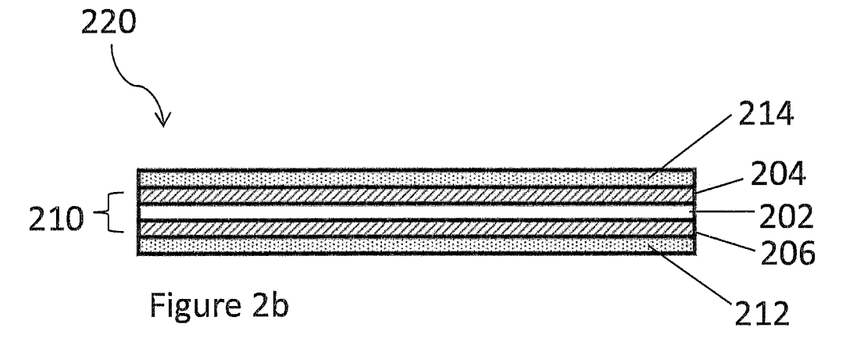

FIG. 2a shows a cross section of a conductive tape according to an embodiment of the present invention. The conductive tape comprises conductive yarns laid in a pattern such as those described above with reference to FIGS. 1a to 1c. FIG. 2b shows a cross section of a textile product incorporating the conductive tape shown in FIG. 2a.

As shown in FIG. 2a, the conductive tape 210 comprises the conductive yarn 202 which is laid in a pattern such as those described above in relation to FIGS. 1a to 1c. The conductive yarn 202 is disposed between a first bonding sheet or glue layer 204 and a second bonding sheet or glue layer 206. The first glue layer 204 and/or the second glue layer 206 may be formed form adhesive tape which may be heat activated.

As shown in FIG. 2b, the conductive tape 210 may be incorporated into a textile product 220. The textile product 220 comprises a fabric layer 212 onto which the conductive tape 210 is disposed. A layer of cover fabric 214 is disposed over the conductive tape 210.

Figure 3A:
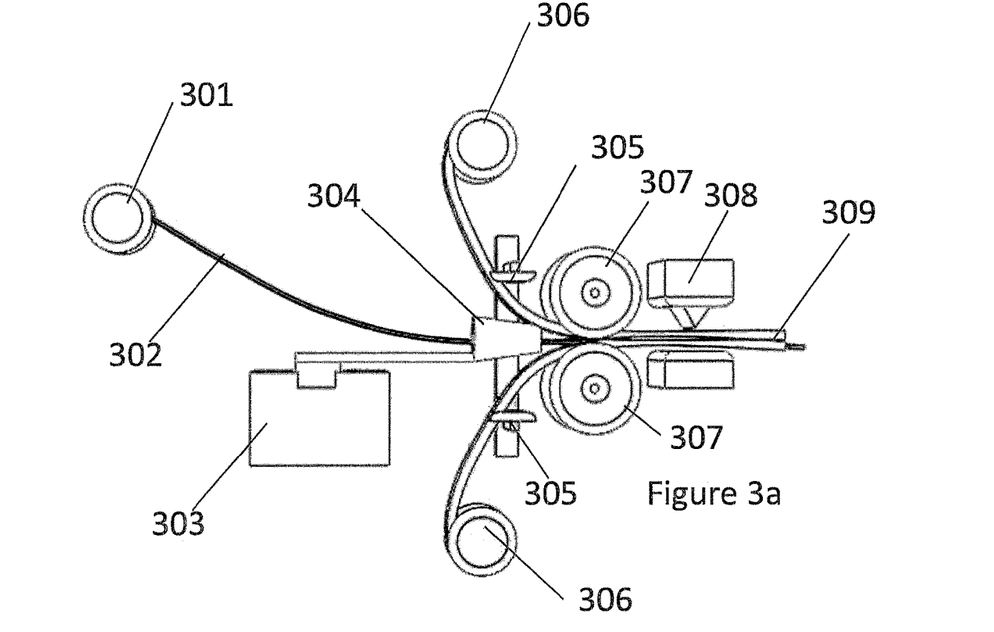
FIGS. 3a and 3b show an apparatus for laying conductive yarn according to an embodiment of the present invention.
Figure 3B:
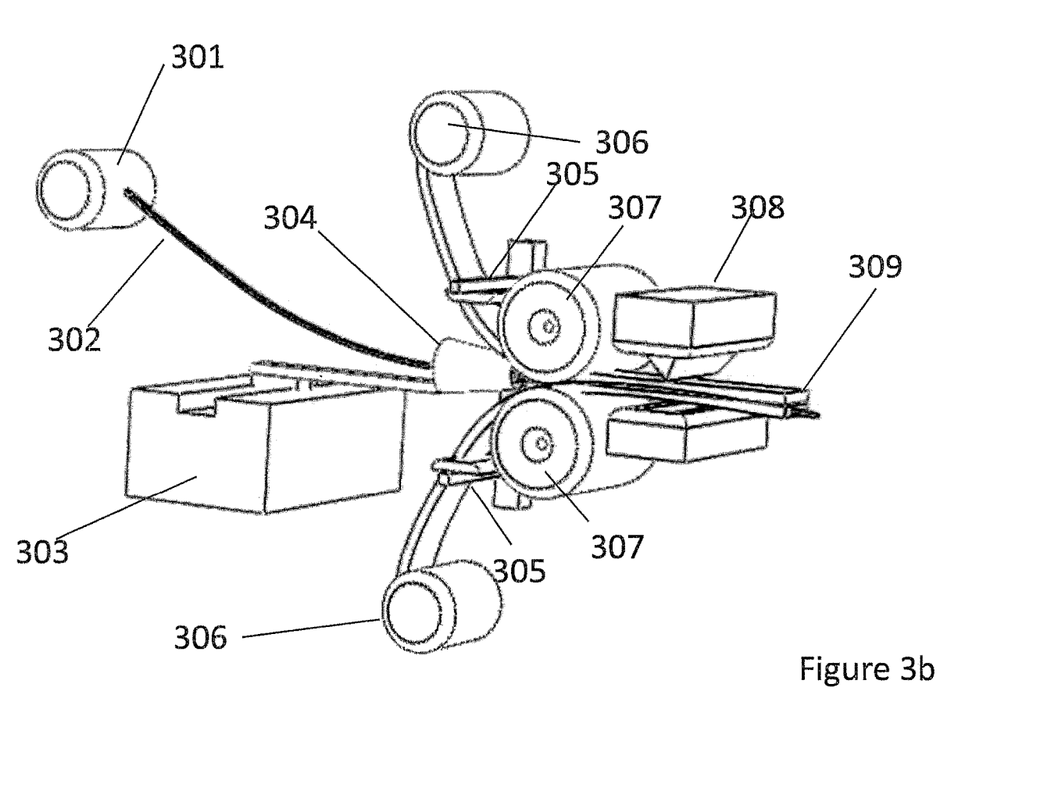

FIGS. 3a and 3b show an apparatus for laying conductive yarn according to an embodiment of the present invention.

As shown in FIGS. 3a and 3b, a yarn corn 301 supplies conductive yarn 302. A linear guide 303 controls the position of a nozzle 304. The nozzle 304 acts as a yarn guide and controls the lateral position of the conductive yarn 302 as it is incorporated into a conductive tape 309. The upper and lower glue layers of the conductive tape are formed from tape which is supplied by tape rolls 306 located above and below the nozzle 304. The tape is heated by heaters 305 before the two tape layers are attached together with the conductive yarn 302 disposed between.

A pair of rollers 307 are arranged to apply a bonding pressure to attach the two tape layers together. A cutter 308 is arranged to cut the bonded conductive tape 309 into the required length.

In order to lay conductive yarn in patterns such as the modified sinusoidal pattern shown in FIG. 1c, the lateral separation of individual conductive yarn paths in the pattern is varied. Therefore, in order to lay the yarn in such patterns, the apparatus 300 shown in FIGS. 3a and 3b comprises a plurality of nozzles each controlled by individual linear guides.

Figure 4:
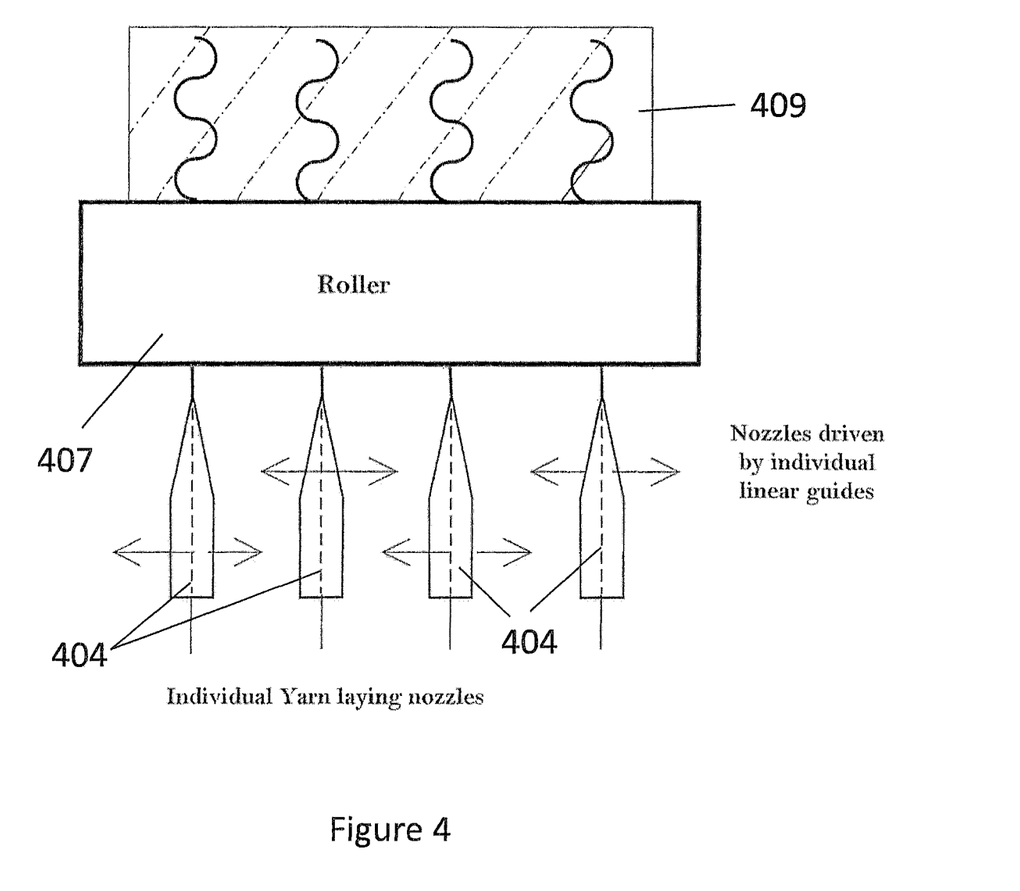
FIG. 4 shows a top down view of an apparatus for laying conductive yarn according to an embodiment of the present invention.

FIG. 4 shows a top down view of an apparatus for laying conductive yarn according to an embodiment of the present invention. As shown in FIG. 4, four nozzles 404 are each controlled by individual linear guides. This allows the lateral separation of the conductive yarn to be varied as the conductive yarn is incorporated into a conductive tape 409 by application of a bonding pressure by a roller 407. Each of the nozzles 404 is configured as described above in relation to FIGS. 3a and 3b so that a plurality of conductive yarns may be laid in the conductive tape 409.

It is noted that the paths in the pattern shown in FIG. 4 are sinusoidal, however, it will be appreciated that the conductive yarn can also be laid in a modified sinusoidal pattern such as that shown in FIG. 1c. Because nozzles 404 are each individually controlled, the lateral separation of the conductive yarn in the conductive tape can be varied.

Those of skill in the art will appreciate that various modifications may be made to the apparatus for laying conductive yarn described above. For example, the nozzles may be substituted for wire loops, needles, or other yarn guides. The bonding pressure applied to the two tape layers may be applied between a pair of surfaces such as a pair of conveyer belts, or between a single roller or conveyer belt and a plate.

In the embodiment shown in FIGS. 2a and 2b, the conductive tape is formed from a plurality of conductive yarns disposed between two tape layers. Embodiments are envisaged in which the conductive yarn is disposed on a single tape layer. Such a tape may be manufactured using an apparatus similar to that described above with reference to FIGS. 3a and 3b, with a single tape roll and in which a pressure to heat is applied to the tape to bond the yarn to the tape.

As described above, the pattern shown in FIG. 1c is produced by varying the lateral separation of conductive yarns on a substrate to maintain a tangential separation of the conductive yarns above a threshold minimum value.

While in the example shown in FIG. 1c, there are three conductive yarn paths, it will be appreciated that patterns with similar properties can be produced with different numbers of conductive yarn paths. For example, embodiments with two paths, four paths, five paths and other numbers of paths are envisaged.

The derivation of a mathematical representation of the modified sinusoidal pattern shown in FIG. 1c will now be described with reference to FIGS. 5a and 5b.

Figure 5A:
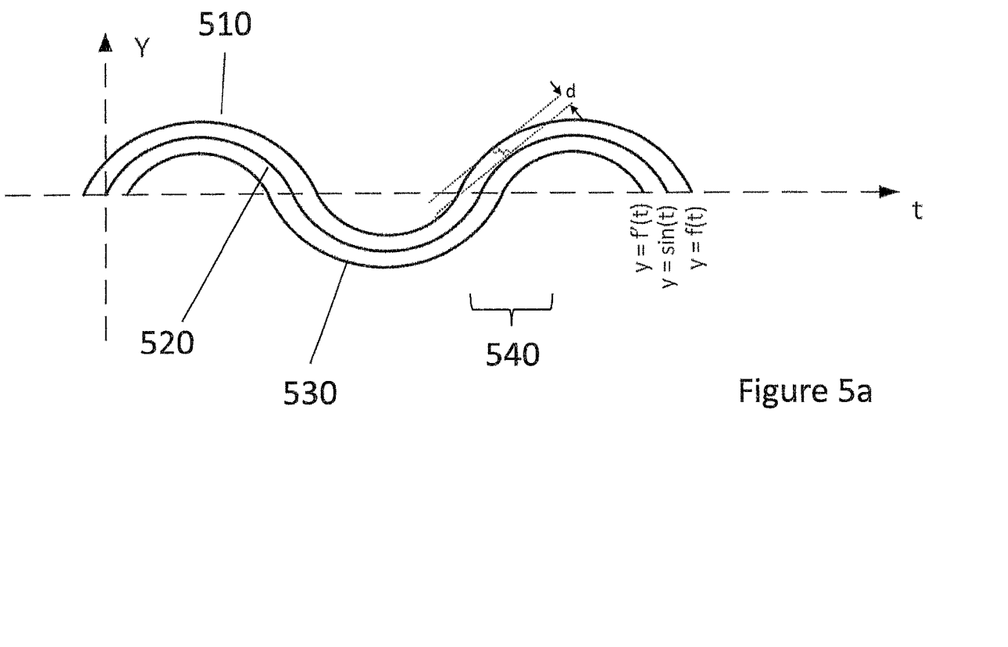
FIGS. 5a and 5b show the derivation of a mathematical representation of the modified sinusoidal pattern used for conductive yarns paths in embodiments of the present invention.

FIG. 5a shows three paths: an upper modified sinusoidal path 510, a sinusoidal path 520 and a lower modified sinusoidal path 530. As shown in FIG. 5a, the upper modified sinusoidal path 510 is a function y=f(t). The sinusoidal path 520 has a function y=sin(t). The lower modified sinusoidal path 530 has a function y=f'(t). As shown in FIG. 5a, the tangential distance between the sinusoidal path 520 and the upper modified sinusoidal path 510 is a constant distance d. Similarly, the tangential distance between the sinusoidal path 520 and the lower modified sinusoidal path 530 is a constant distance d.

Figure 5B:
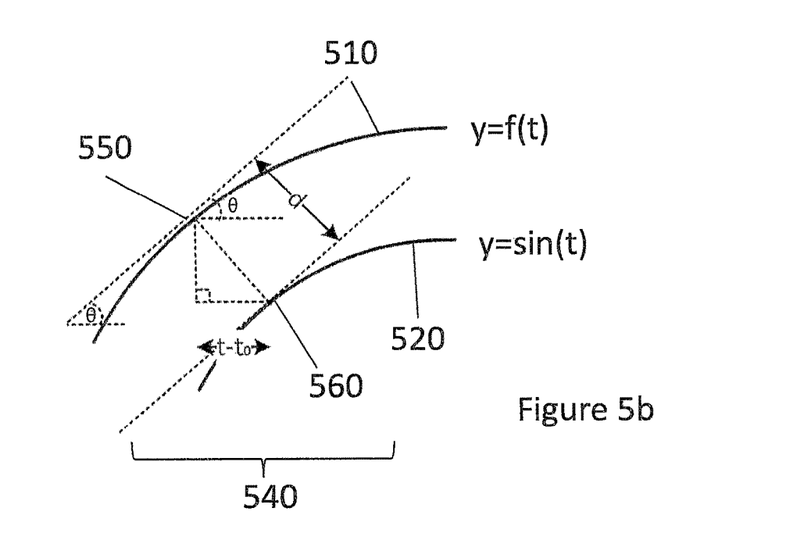

FIG. 5b shows the upper modified sinusoidal path 510 and the sinusoidal path 520 and the tangential angle θ in the region 540 of FIG. 5a.

As shown in FIG. 5b, one instance of the tangential distance d runs from a point 550 which corresponds to $f(t-t_0)$ on the upper modified sinusoidal path 510 to a point 560 which corresponds to sin(t) on the sinusoidal path 520.

As can be seen from FIG. 5b, the gradient of the upper modified sinusoidal path 520 at the point 550 which corresponds to $f(t-t_0)$ is given by:

$$\frac{d}{dx}[f(t-t_0)] = \tan\theta$$

This is equal to the gradient of the sinusoidal path 520 at the point 560 where the tangent meets the sinusoidal path 520. Thus:

$$\frac{d}{dt}[f(t-t_0)] = \tan\theta = \frac{d}{dt}[\sin(t)] = \cos(t) \qquad (1)$$

Integrating both sides gives:

$$f(t-t_0) = \int \cos(t)\, dt \qquad (2)$$
$$= \sin(t) + C$$
$$\therefore f(t) = \sin(t+t_0) + C$$

From equation (1) above, it can be seen that tan θ=cos(t), $$\therefore \theta = \tan^{-1}(\cos(t)) \qquad (3)$$

Considering the right angle triangle formed by tangent shown in FIG. 5b, it can be seen that $$t_0 = d\,\sin(\theta)$$

Substituting equation (3) for θ gives:

$$t_0 = d\,\sin(\tan^{-1}(\cos(t)))$$

Substituting this into equation (2) gives:

$$f(t) = \sin(t + d\,\sin(\tan^{-1}(\cos(t)))) + C$$

The value of the constant C can be set as d/5, thus giving:

$$f(t) = \sin(t + d\sin(\tan^{-1}(\cos(t)))) + \frac{d}{5}$$

A similar analysis gives:

$$f'(t) = \sin(t - d\sin(\tan^{-1}(\cos(t)))) - \frac{d}{5}$$

Thus the two above equations for f(t) and f'(t) provide a mathematical representation of the modified sinusoidal paths. It is noted that a sinusoidal path may be included between the two modified sinusoidal paths if three paths are required. If two paths are required, the sinusoidal path may be omitted leaving two modified sinusoidal paths.

Figure 6:
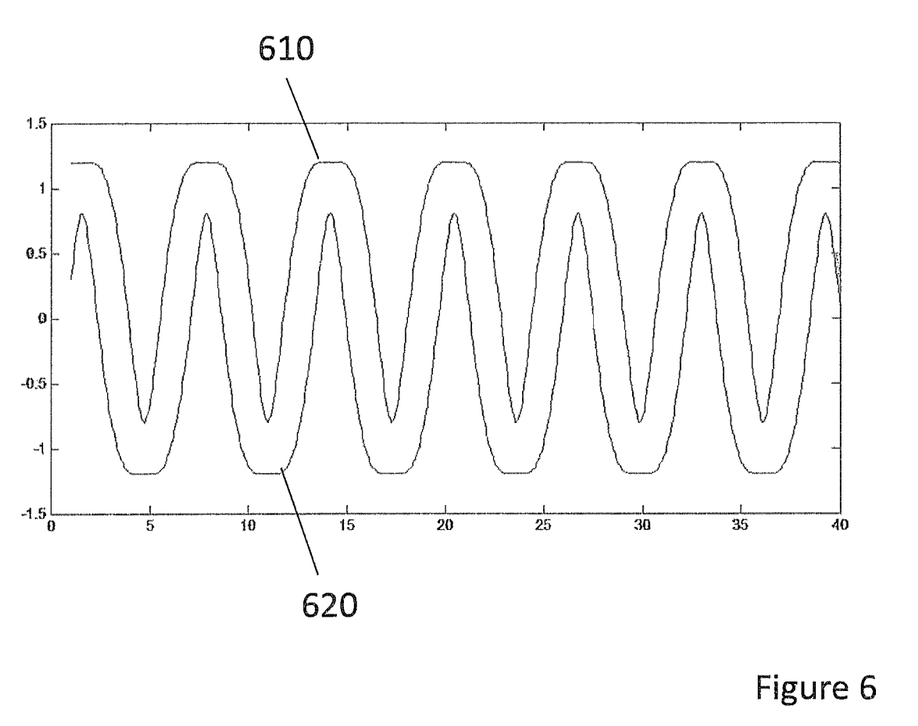
FIG. 6 shows a pattern for conductive yarn paths according to an embodiment of the present invention.

FIG. 6 shows two modified sinusoidal paths which may be used in embodiments of the present invention. A first modified sinusoidal path 610 runs above a second modified sinusoidal path 620. The two modified sinusoidal paths are plotted according to the equations for f(t) and f'(t) derived above.

Figure 7A:
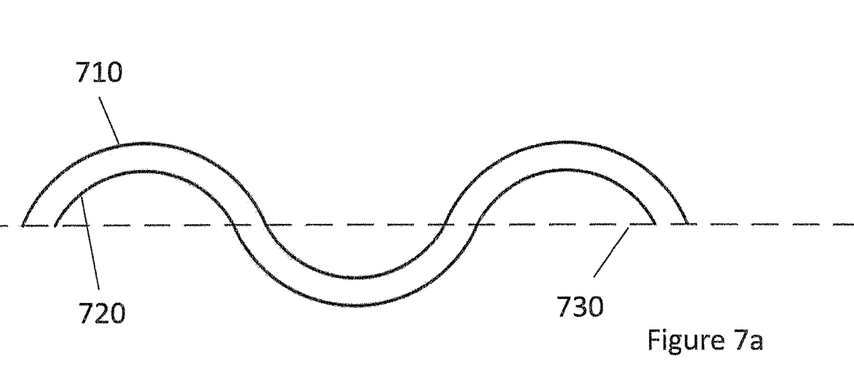
FIGS. 7a and 7b show patterns for conductive yarn paths according to embodiments of the present invention.
Figure 7B:
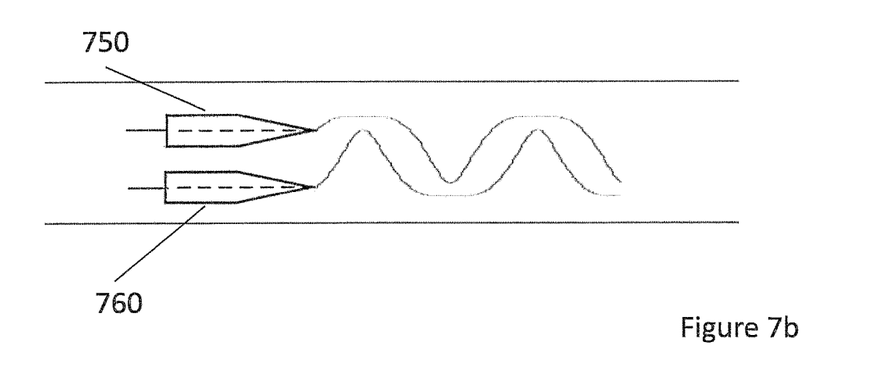

FIGS. 7a and 7b show modified sinusoidal paths which approximate the equations derived above.

In the embodiment shown in FIG. 7a, an upper modified sinusoidal path 710 and a lower modified sinusoidal path 720 are each formed from sections of sinusoidal curves. The two paths alternate between sinusoidal curves multiplied by different factors. The overall pattern is symmetrical about a horizontal line 730. When the paths are above the horizontal line 730, the upper sinusoidal path 710 is formed from a sine wave given by y=$d_1$ sin(t) and the lower sinusoidal path is formed from a sine wave given by y=$d_2$ sin(t). Here $d_1$ is greater than $d_2$ so the curvature of the lower sinusoidal path 720 is greater than the curvature of the upper sinusoidal path 710 when the paths are above the horizontal line 730.

When the paths are below the horizontal line 730, the upper sinusoidal path 710 is formed from a sine wave given by y=$d_2$ sin(t) and the lower sinusoidal path 720 is formed from a sine wave given by y=$d_1$ sin(t). Since $d_1$ is greater than $d_2$ the curvature of the upper sinusoidal path 710 is greater than the curvature of the lower sinusoidal path 720 when the paths are below the horizontal line 730.

In the embodiment shown in FIG. 7b, the lateral velocities of a first nozzle 750 and a second nozzle 760 are controlled to different speeds depending on whether the nozzle is moving inwards (that is towards the other nozzle), or outwards (that is away from the other nozzle). At each nozzle, the inward speed is $v_1$ and the outward speed is $v_1+v_0$. This makes the outward movement faster and therefore, the outside curve is bigger. By changing the ratio $v_1/v_0$ an optimum gap can be reached.

In the embodiments described above, the conductive yarns are attached to a fabric substrate with glue tape, however the patterns described herein may also be implemented in textile products with other methods of attachment such as stitching or embroidering.

In the embodiments described above conductive pathways are formed by laying conductive yarns. The patterns described above may also be laid by printing or laying conductive ink onto a tape layer.

Figure 8:
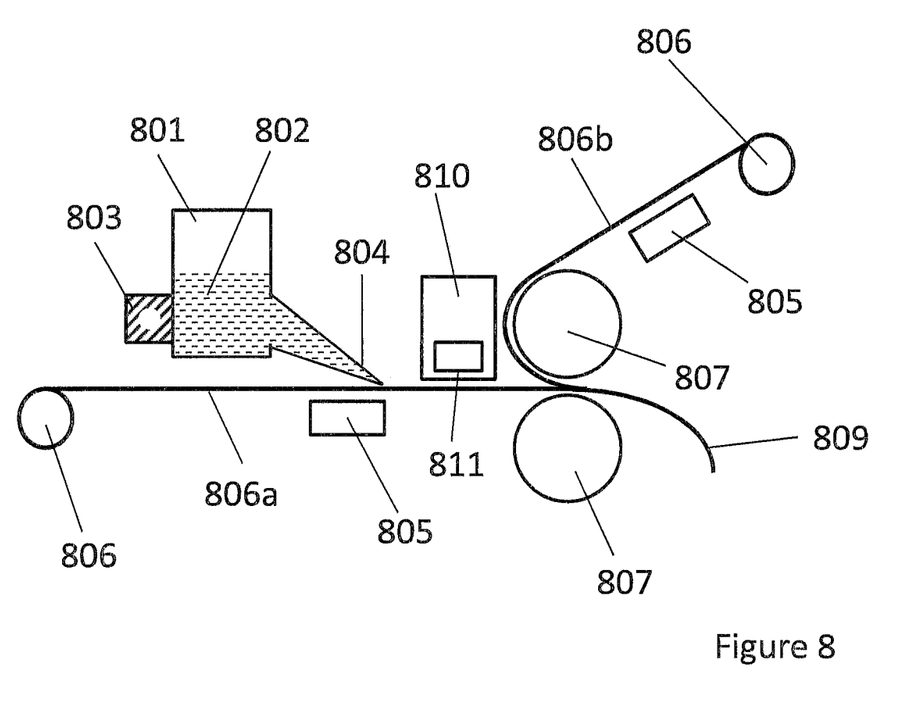
FIG. 8 shows side on view of an apparatus for forming a conductive tape by laying a conductive ink according to an embodiment of the present invention.

FIG. 8 shows side on view of an apparatus for forming a conductive tape by laying a conductive ink according to an embodiment of the present invention. An ink chamber 801 contains a conductive ink 802. The conductive ink 802 may comprise a silver-based ink, a carbon-based ink, a graphite-based ink, in some embodiments the conductive ink comprises nanotubes or nanoparticles of these materials. The ink chamber 801 has a nozzle 804 that deposits the conductive ink 802 onto a lower tape layer 806a. The nozzle 804 may comprise a valve to control the ink flow. In some embodiments, the flow of conductive ink 802 through the nozzle 804 takes place due to gravity or surface tension.

A servo linear drive mechanism 803 controls the lateral position of the ink chamber 801 and the nozzle 804 on the lower tape layer 806a. As the tape moves past the nozzle 804, a conductive pathway formed from conductive ink 802 is laid on the tape layer. Thus by varying the position of the nozzle 804 using the servo linear guide mechanism 803 as the tape moves past the nozzle 804 a pattern as described above is formed on the tape layer.

An ink curing unit 810 which comprises a ultra-violet lamp or heater 811 is located above the lower tape layer 806a. The ink-curing unit 810 is configured to cure the conductive ink 802 after the conductive ink 802 has been laid on the lower tape layer 806a.

An upper glue layer 806b and a lower glue layer 806a which form a conductive tape 809 are supplied by tape rolls 806. The tape is heated by heaters 805 before the two tape layers are bonded together with the conductive pathway between them.

A pair of rollers 807 are arranged to apply a bonding pressure to attach the two tape layers together to form the conductive tape 809. Although not shown in FIG. 8, a cutter may be arranged after the rollers 807 to cut the conductive tape 809 into the required length.

Figure 9:
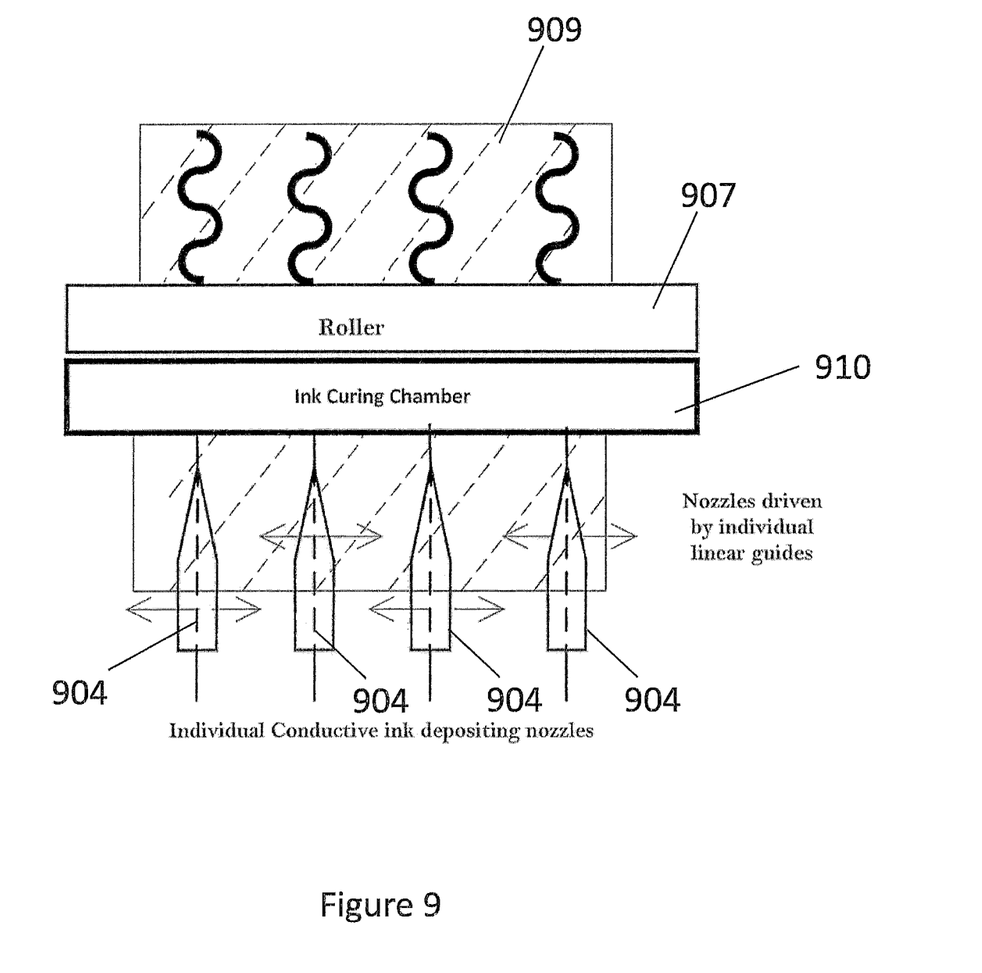
FIG. 9 shows a top down view of an apparatus for forming conductive tape by laying a conductive ink according to an embodiment of the present invention.

FIG. 9 shows a top down view of an apparatus for forming conductive tape by laying a conductive ink according to an embodiment of the present invention. As shown in FIG. 9, four nozzles 904 are each controlled by individual linear guides. This means that the lateral separation between the nozzles can be varied. Each of the nozzles 904 is configured as described above in relation to FIG. 8. In use, each nozzle 904 lays conductive ink on a tape layer. The conductive ink is then cured by an ink curing chamber 910. The conductive ink may be cured by heating, ultra-violet light or by application of a chemical curing agent. Once the conductive ink has been cured, a roller 907 applies a bonding pressure to the tape to form conductive tape 909.

It is noted that the patterns of the conductive pathways shown in the conductive tape 909 in FIG. 9 are sinusoidal, however, it will be appreciated that the conductive pathways may form patterns described above, such as the modified sinusoidal patterns shown in FIG. 1c, FIGS. 5a, 5b, FIG. 6 and FIGS. 7a and 7b. Because the nozzles 904 can be independently controlled, the conductive pathways can be laid such that the lateral separation varies.

Whilst the foregoing description has described exemplary embodiments, it will be understood by those skilled in the art that many variations of the embodiments can be made within the scope and spirit of the present invention.

The invention claimed is:

1. A textile product comprising
    a substrate; and
    a first conductive pathway and a second conductive pathway disposed on or within the substrate, wherein
    the first conductive pathway is arranged in a first repeating curved pattern along a path direction;
    the second conductive pathway is arranged in a second repeating curved pattern along the path direction;

a lateral separation, in a direction perpendicular to the path direction, of the first conductive pathway and the second conductive pathway varies such that a tangential separation of the first conductive pathway and the second conductive pathway is above a threshold value; and the first repeating curved pattern and the second repeating curved pattern alternate between a first sinusoidal function and a second sinusoidal function, wherein the second sinusoidal function has a greater amplitude than the first sinusoidal function.

2. A textile product according to claim 1 wherein the substrate is a stretchable substrate.

3. A textile product according to claim 1 wherein the first conductive pathway comprises a first conductive yarn and the second conductive pathway comprises a second conductive yarn.

4. A textile product according to claim 1 wherein the first conductive pathway and/or the second conductive pathway are printed with a conductive ink.

5. A textile product according to claim 1, wherein the first repeating curved pattern and the second curved repeating pattern are modified sinusoidal patterns.

6. A textile product according to claim 1, further comprising a third conductive pathway arranged between the first conductive pathway and the second conductive pathway.

7. A textile product according to claim 6, wherein the third conductive pathway is arranged in a sinusoidal pattern and the first conductive pathway and the second conductive pathway are arranged in the modified sinusoidal patterns.

8. A textile product comprising
a substrate; and
a first conductive pathway and a second conductive pathway disposed on or within the substrate, wherein the first conductive pathway is arranged in a first repeating curved pattern;

the second conductive pathway is arranged in a second repeating curved pattern;

the first repeating curved pattern and the second repeating curved pattern repeat in a path direction;

a lateral separation of the first conductive pathway and the second conductive pathway, in a direction perpendicular to the path direction, varies such that a tangential separation of the first conductive pathway and the second conductive pathway is above a threshold value; and the first repeating curved pattern and the second repeating curved pattern alternate between a first sinusoidal function and a second sinusoidal function, wherein the second sinusoidal function has a greater amplitude than the first sinusoidal function.

9. A textile product according to claim 8 wherein the substrate is a stretchable substrate.

10. A textile product according to claim 8 wherein the first conductive pathway comprises a first conductive yarn and the second conductive pathway comprises a second conductive yarn.

11. A textile product according to claim 8 wherein the first conductive pathway and/or the second conductive pathway are minted with a conductive ink.

12. A textile product according to claim 8, wherein the first repeating curved pattern and the second curved repeating pattern are modified sinusoidal patterns.

13. A textile product according to claim 8, further comprising a third conductive pathway arranged between the first conductive pathway and the second conductive pathway.

14. A textile product according to claim 13, wherein the third conductive pathway is arranged in a sinusoidal pattern and the first conductive pathway and the second conductive pathway are arranged in the modified sinusoidal patterns.

* * * * *